US 8,076,193 B2

(12) United States Patent
Sato et al.

(10) Patent No.: US 8,076,193 B2
(45) Date of Patent: Dec. 13, 2011

(54) CMOS DEVICE FABRICATION METHOD WITH PMOS INTERFACE INSULATING FILM FORMED CONCURRENTLY WITH SIDEWALL INSULATING FILM

(75) Inventors: Motoyuki Sato, Yokohama (JP); Takeshi Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1011 days.

(21) Appl. No.: 11/377,686

(22) Filed: Mar. 17, 2006

(65) Prior Publication Data
US 2007/0069303 A1    Mar. 29, 2007

(30) Foreign Application Priority Data

Sep. 28, 2005    (JP) .................................. 2005-281537

(51) Int. Cl.
*H01L 21/283*    (2006.01)
*H01L 21/336*    (2006.01)

(52) U.S. Cl. .. 438/216; 438/287; 438/591; 257/E21.194
(58) Field of Classification Search ................... 438/142, 438/153, 154, 169, 188, 197, 199, 216, 218, 438/219, 221, 287, 584, 585, 591, 595; 257/E21.001, E21.002, E21.04, E21.158, 257/E21.19, E21.191, E21.192, E21.193, 257/E21.194, E21.195, E21.196, E21.197, 257/E21.198, E21.199, E21.2
See application file for complete search history.

(56) References Cited

FOREIGN PATENT DOCUMENTS

| JP | 09-205151 | 8/1997 |
|---|---|---|
| JP | 2000-216373 | 8/2000 |
| JP | 2004-289061 | 10/2004 |
| JP | 2005-108875 | 4/2005 |

OTHER PUBLICATIONS

Watanabe et al., "Impact of Hf Concentration on Performance and Reliability for HfSiON-CMOSFET", IEDM Tech. Dig., IEEE, pp. 20.3.1-20.3.4, (2004).

Notification of Reasons for Rejection issued by the Japanese Patent Office on Aug. 5, 2011, for Japanese Patent Application No. 2005-281537 and English language translation thereof.

*Primary Examiner* — Lynne Gurley
*Assistant Examiner* — Andrew O. Arena
(74) *Attorney, Agent, or Firm* — Finnegan, Henderson, Farabow, Garrett & Dunner, L.L.P.

(57) ABSTRACT

According to one aspect of the invention, there is provided a semiconductor device fabrication method comprising:
forming a first gate electrode via a first gate insulating film on a P-type semiconductor region formed in a surface portion of a semiconductor substrate, and forming a second gate electrode via a second gate insulating film on an N-type semiconductor region formed in the surface portion of the semiconductor substrate;
forming a first insulating film on side surfaces of the first gate electrode and the first gate insulating film, and forming a second insulating film on side surfaces of the second gate electrode and the second gate insulating film;
forming a mask having a pattern corresponding to the P-type semiconductor region;
etching away the second insulating film by using the mask;
removing the mask; and
forming a first gate electrode sidewall insulating film on the side surfaces of the first insulating film, and forming a second gate electrode sidewall insulating film on the side surfaces of the second gate electrode and the second gate insulating film, thereby forming an interface insulating film in an interface between the second gate electrode and the second gate insulating film.

14 Claims, 4 Drawing Sheets

CMOS DEVICE FABRICATION METHOD WITH PMOS INTERFACE INSULATING FILM FORMED CONCURRENTLY WITH SIDEWALL INSULATING FILM

CROSS REFERENCE TO RELATED APPLICATION

This application is based upon and claims benefit of priority under 35 USC §119 from the Japanese Patent Application No. 2005-281537, filed on Sep. 28, 2005, the entire contents of which are incorporated herein by reference.

BACKGROUND OF THE INVENTION

The present invention relates to a semiconductor device and a method of fabricating the same.

Recently, the film thickness of a gate insulating film decreases as downsizing of MOSFETs advances, and this poses the problem that a gate leakage current increases. To suppress this gate leakage current, therefore, it is proposed to use a high-k film having a relative dielectric constant higher than that of a silicon oxide ($SiO_2$) film as a gate insulating film. An example of this high-k film is a hafnium silicate nitride (HfSiON) film.

When a complementary MOS transistor (to be referred to as a CMOSFET hereinafter) including a PMOSFET and NMOSFET is to be formed, however, if this hafnium silicate nitride (HfSiON) film is used as a gate insulating film, the gate threshold voltage of the PMOSFET fluctuates more than that of the NMOSFET.

In this case, a driving current flowing through a channel region reduces more in the PMOSFET than in the NMOSFET, so the drivability of the PMOSFET decreases. This produces a large difference in drivability between the PMOSFET and NMOSFET.

A reference related to a CMOSFET using a high-k gate insulating film is as follows.

Japanese Patent Laid-Open No. 2004-289061

SUMMARY OF THE INVENTION

According to one aspect of the invention, there is provided a semiconductor device fabrication method comprising:

forming a first gate electrode via a first gate insulating film on a P-type semiconductor region formed in a surface portion of a semiconductor substrate, and forming a second gate electrode via a second gate insulating film on an N-type semiconductor region formed in the surface portion of the semiconductor substrate;

forming a first insulating film on side surfaces of the first gate electrode and the first gate insulating film, and forming a second insulating film on side surfaces of the second gate electrode and the second gate insulating film;

forming a mask having a pattern corresponding to the P-type semiconductor region;

etching away the second insulating film by using the mask;
removing the mask; and forming a first gate electrode sidewall insulating film on the side surfaces of the first insulating film, and forming a second gate electrode sidewall insulating film on the side surfaces of the second gate electrode and the second gate insulating film, thereby forming an interface insulating film in an interface between the second gate electrode and the second gate insulating film.

According to one aspect of the invention, there is provided a semiconductor device comprising:

a first gate insulating film formed on a P-type semiconductor region in a surface portion of a semiconductor substrate;

a first gate electrode formed on said first gate insulating film;

a first gate electrode sidewall insulating film formed on side surfaces of said first gate electrode and said first gate insulating film via an insulating film;

an N-channel transistor having a first source region and a first drain region formed on two sides of a first channel region formed in a surface portion of said P-type semiconductor region below said first gate electrode;

a second gate insulating film formed on an N-type semiconductor region in the surface portion of said semiconductor substrate;

a second gate electrode formed on said second gate insulating film via an interface insulating film;

a second gate electrode sidewall insulating film formed on side surfaces of said second gate electrode, said interface insulating film, and said second gate insulating film; and a P-channel transistor having a second source region and a second drain region formed on two sides of a second channel region formed in a surface portion of said N-type semiconductor region below said second gate electrode.

DETAILED DESCRIPTION OF THE INVENTION

An embodiment of the present invention will be described below with reference to the accompanying drawings.

FIGS. 1 to 10 illustrate a method of fabricating a CMOSFET according to an embodiment of the present invention. First, a resist mask having a desired pattern is formed on a semiconductor substrate 10 by photolithography, and used as a mask to ion-implant boron (B), gallium (G), indium (In), or the like.

Figure 1:
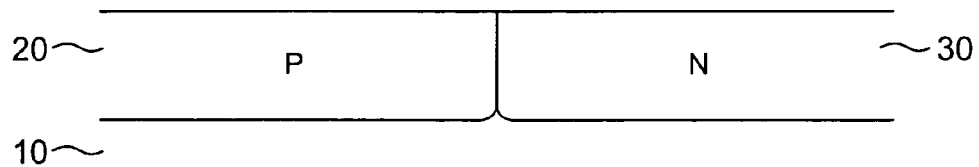
FIG. 1 is a longitudinal sectional view showing an element sectional structure in a predetermined step of a method of fabricating a CMOSFET according to an embodiment of the present invention.
Figure 2:
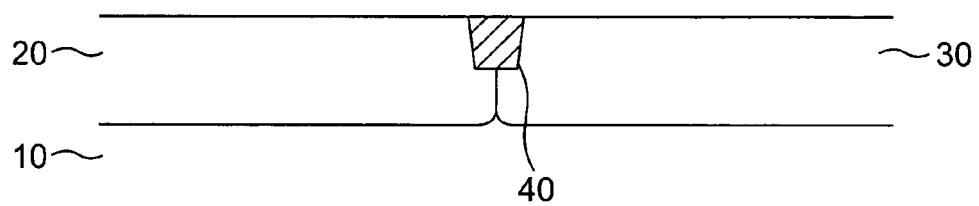
FIG. 2 is a longitudinal sectional view showing an element sectional structure in a predetermined step of a method of fabricating the CMOSFET.

Similarly, a resist mask having a desired pattern is formed on the semiconductor substrate 10, and used as a mask to ion-implant phosphorus (P), arsenic (As), antimony (Sb), or the like. Annealing is then performed to form a P-type semiconductor region 20 and N-type semiconductor region 30 as shown in FIG. 1. Subsequently, as shown in FIG. 2, an element isolation insulating film 40 is formed in a desired region on the semiconductor substrate 10.

After that, an insulating film made of, e.g., a hafnium silicate nitride (HfSiON) film is formed on the surface of the semiconductor substrate 10. Note that this insulating film is not limited to the hafnium silicate nitride film. That is, it is possible to use various types of high-k films having relative dielectric constants higher than that of a silicon oxide ($SiO_2$) film. Examples are a hafnium oxide (HfOx) film, a zirconium oxide (ZrOx) film, a silicate film of a hafnium oxide film, an aluminate film of a hafnium oxide film, a silicate film of a zirconium oxide film, an aluminate film of a zirconium oxide film, a silicate nitride film of a hafnium oxide film, an aluminate nitride film of a hafnium oxide film, a silicate nitride film of a zirconium oxide film, and an aluminate nitride film of a zirconium oxide film.

Polysilicon is deposited on this insulating film by CVD or the like to form a polysilicon film. In this case, a polysilicon germanium film may also be formed by depositing polysilicon germanium on the insulating film.

Figure 3:
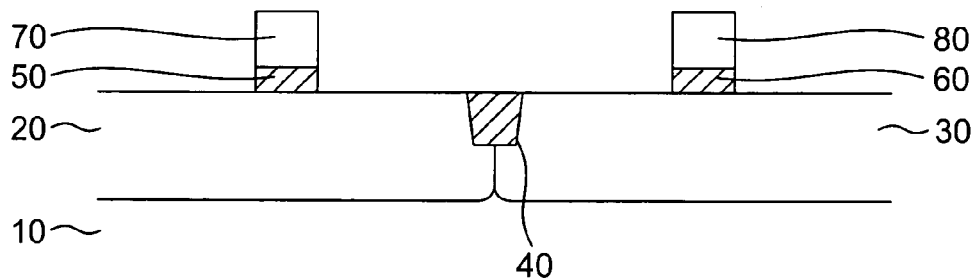
FIG. 3 is a longitudinal sectional view showing an element sectional structure in a predetermined step of a method of fabricating the CMOSFET.

As shown in FIG. 3, the polysilicon film and hafnium silicate nitride (HfSiON) film are sequentially patterned by lithography and RIE, thereby forming a gate electrode 70 and gate insulating film 50 on the P-type semiconductor region 20, and a gate electrode 80 and gate insulating film 60 on the N-type semiconductor region 30.

Figure 4:
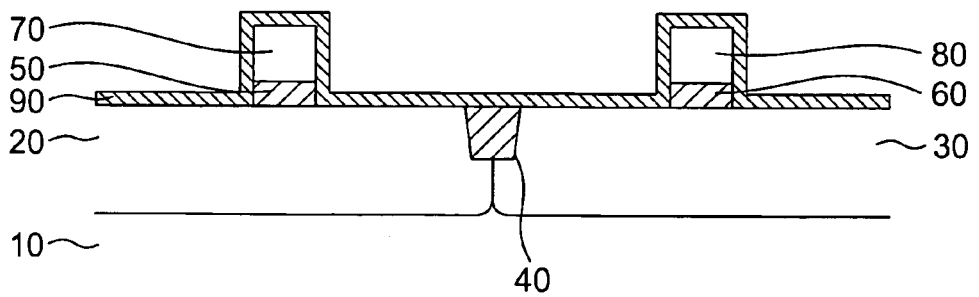
FIG. 4 is a longitudinal sectional view showing an element sectional structure in a predetermined step of a method of fabricating the CMOSFET.
Figure 5:
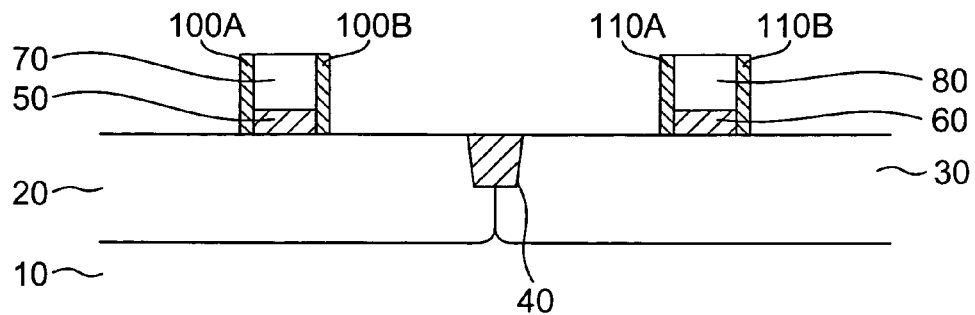
FIG. 5 is a longitudinal sectional view showing an element sectional structure in a predetermined step of a method of fabricating the CMOSFET.

As shown in FIG. 4, a silicon nitride (SiN) film 90 about 2 nm thick is formed on the entire surface. As shown in FIG. 5, the silicon nitride (SiN) film 90 is removed by RIE except for the silicon nitride (SiN) film 90 formed on the side surfaces of the gate electrode 70 and gate insulating film 50, and on the side surfaces of the gate electrode 80 and gate insulating film 60. In this manner, offset spacers 100A and 100B are formed on the side surfaces of the gate electrode 70 and gate insulating film 50, and offset spacers 110A and 110B are formed on the side surfaces of the gate electrode 80 and gate insulating film 60.

Figure 6:
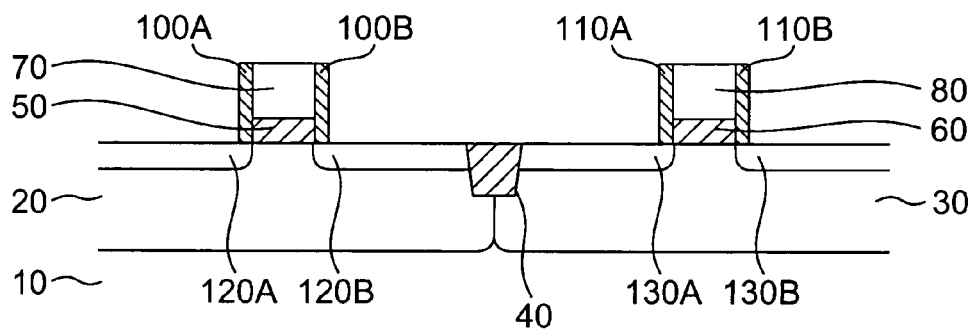
FIG. 6 is a longitudinal sectional view showing an element sectional structure in a predetermined step of a method of fabricating the CMOSFET.

As shown in FIG. 6, an N-type dopant such as phosphorus (P) is ion-implanted into the P-type semiconductor region 20, and annealing is so performed as to diffuse this phosphorus (P), thereby forming a shallow-junction, lightly doped source extension region 120A and drain extension region 120B.

Also, a P-type dopant such as boron (B) is ion-implanted into the N-type semiconductor region 30, and annealing is so performed as to diffuse this boron (B), thereby forming a shallow-junction, lightly doped source extension region 130A and drain extension region 130B.

Figure 7:
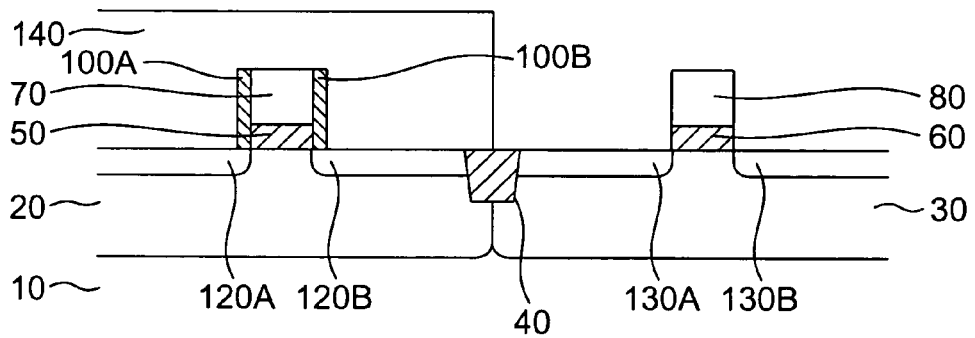
FIG. 7 is a longitudinal sectional view showing an element sectional structure in a predetermined step of a method of fabricating the CMOSFET.

As shown in FIG. 7, the semiconductor substrate 10, gate electrodes 70 and 80, and offset spacers 100 and 110 are coated with a photoresist, and the photoresist is exposed and developed to form a resist mask 140 having a pattern which opens over the N-type semiconductor region 30, thereby covering the P-type semiconductor region 20 with the resist mask 140.

The resist mask 140 is used as a mask to etch away the offset spacers 110A and 110B formed in the N-type semiconductor region 30.

Note that wet etching using hydrofluoric acid (HF) may also be performed instead of RIE. In this case, the offset spacers 110A and 110B may also be removed after they are changed into an oxynitride film or oxide film by radical oxidation or thermal oxidation. Alternatively, the source extension region 130A and drain extension region 130B may also be formed after the offset spacers 110A and 110B are removed.

Figure 8:
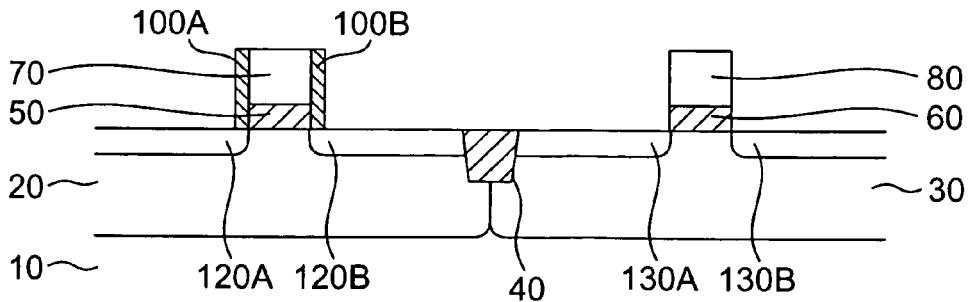
FIG. 8 is a longitudinal sectional view showing an element sectional structure in a predetermined step of a method of fabricating the CMOSFET.
Figure 9:
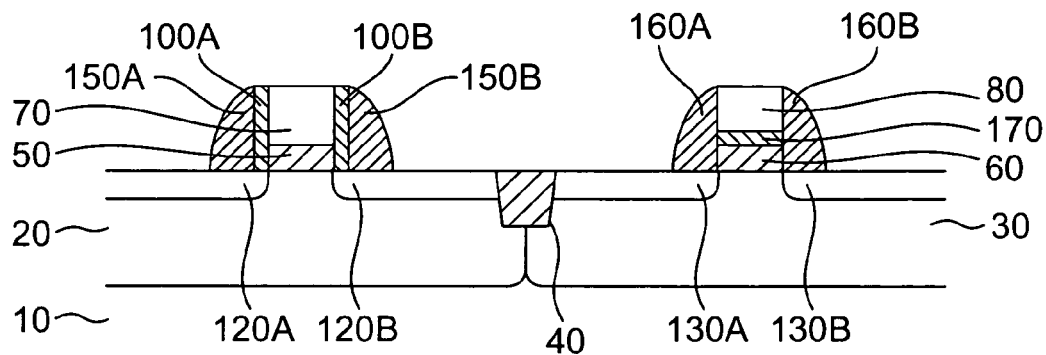
FIG. 9 is a longitudinal sectional view showing an element sectional structure in a predetermined step of a method of fabricating the CMOSFET.

As shown in FIG. 8, after the resist mask 90 is removed, a silicon oxide ($SiO_2$) film made of, e.g., a TEOS (tetraethoxysilane) film is formed on the entire surface of the semiconductor substrate 10. As shown in FIG. 9, this silicon oxide ($SiO_2$) film is etched by RIE to form gate electrode side walls 150A and 150B on the side surfaces of the offset spacers 100A and 100B, and gate electrode side walls 160A and 160B on the side surfaces of the gate electrode 80 and gate insulating film 60.

In this state, the gate electrode side walls 160A and 160B act on the interface between the gate electrode 80 and gate insulating film 60 formed on the N-type semiconductor region 30, thereby forming a low-k interface insulating film (interface layer) 170 made of a silicon oxide ($SiO_2$) film about 2 to 3 nm thick in the interface between the gate electrode 80 and gate insulating film 60.

On the other hand, the offset spacers 100A and 100B are already formed on the side surfaces of the gate electrode 70 and gate insulating film 50 formed on the P-type semiconductor region 20. Therefore, even when the gate electrode side walls 150A and 150B are formed, they do not act on the interface between the gate electrode 70 and gate insulating film 50, so almost no interface insulating film forms.

Although a silicon oxide film made of a TEOS film is used as the gate electrode side walls 150 and 160 in this embodiment, it is also possible to use any of various silicon oxide films such as HTO (High Temperature Oxide), BPSG (Borophosphosilicate Glass), PSG (Phosphosilicate Glass), and BSG (Boron-Silicate Glass).

Figure 10:
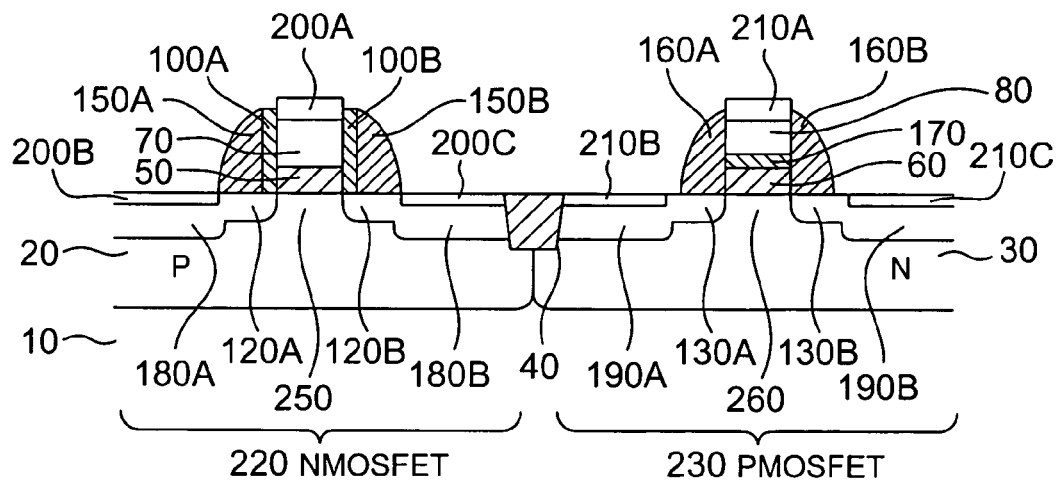
FIG. 10 is a longitudinal sectional view showing an element sectional structure in a predetermined step of a method of fabricating the CMOSFET.

As shown in FIG. 10, an N-type dopant such as phosphorus (P) is ion-implanted into the P-type semiconductor region 20, and annealing is so performed as to diffuse this phosphorus (P), thereby forming a source region 180A and drain region 180B.

Also, a P-type dopant such as boron (B) is ion-implanted into the N-type semiconductor region 30, and annealing is so performed as to diffuse this boron (B), thereby forming a source region 190A and drain region 190B.

After a metal film made of, e.g., cobalt (Co), nickel (Ni), or platinum (Pt) is formed by sputtering, annealing is performed to form suicides 200A to 200C for reducing the parasitic resistance on the surface of the gate electrode 70 and in the surface portions of the source region 180A and drain region 180B, and form silicides 210A to 210C on the surface of the gate electrode 80 and in the surface portions of the source region 190A and drain region 190B.

Subsequently, an interlayer dielectric film (not shown) is formed, and a wiring step is performed by forming contact plugs (not shown) in this interlayer dielectric film, thereby forming a CMOSFET 240 including an NMOSFET 220 and PMOSFET 230.

In the CMOSFET 240 fabricated by the above method, as shown in FIG. 10, the element isolation insulating film 40 is formed in the surface portion of the semiconductor substrate 10. Near the central portion of the P-type semiconductor region 20 isolated by the element isolation insulating film 40, the gate electrode 70 is formed via the gate insulating film 50 formed on the surface of the semiconductor substrate 10.

The gate electrode side walls 150A and 150B are formed on the side surfaces of the gate electrode 70 and gate insulating film 50 via the offset spacers 100A and 100B about 2 nm thick. Also, a channel region 250 is formed near the surface of the semiconductor substrate 10 below the gate electrode 70.

The source extension region 120A and drain extension region 120B are formed on the two ends of the channel region 250.

The source region 180A is formed between the source extension region 120A and an element isolation insulating film (not shown). The drain region 180B is formed between the drain extension region 120B and element isolation insulating film 40.

In addition, the suicides 200A to 200C for reducing the parasitic resistance are formed on the surface of the gate electrode 70 and on the surfaces of the source region 180A and drain region 180B.

On the other hand, the gate electrode 80 is formed near the central portion of the N-type semiconductor region 30 via the gate insulating film 60 formed on the surface of the semiconductor substrate 10, and the interface insulating film 170 made of a silicon oxide ($SiO_2$) film about 2 to 3 nm thick.

The gate electrode side walls 160A and 160B are formed on the side surfaces of the gate electrode 80, interface insulating film 170, and gate insulating film 60. Also, a channel region 260 is formed near the surface of the semiconductor substrate 10 below the gate electrode 80.

The source extension region 130A and drain extension region 130B are formed on the two ends of the channel region 260.

The source region 190A is formed between the source extension region 130A and element isolation insulating film 40. The drain region 190B is formed between the drain extension region 130B and an element isolation insulating film (not shown).

In addition, the suicides 210A to 210C for reducing the parasitic resistance are formed on the surface of the gate electrode 80 and on the surfaces of the source region 190A and drain region 190B.

Figure 11:
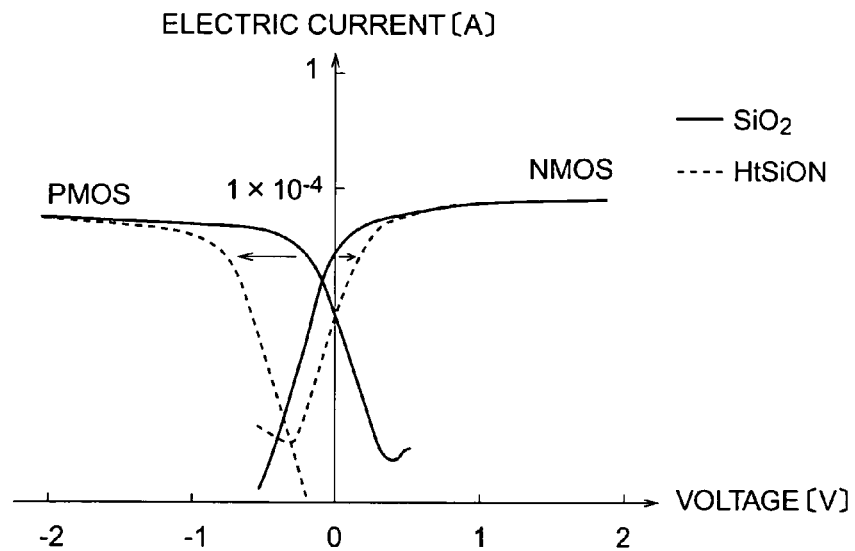
FIG. 11 is a graph showing the current-voltage characteristics of an NMOSFET and PMOSFET forming the CMOSFET.
Figure 12:
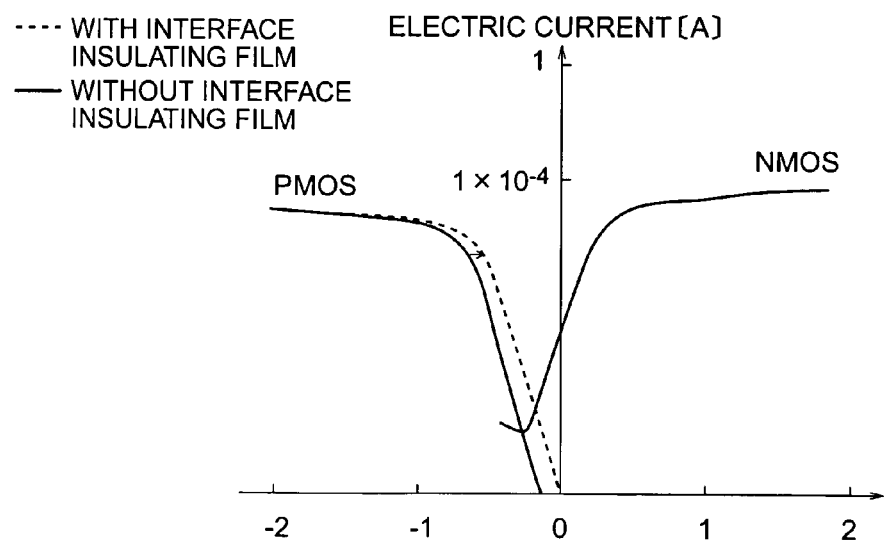
FIG. 12 is a graph showing the current-voltage characteristics of an NMOSFET and PMOSFET forming the CMOSFET.

FIGS. 11 and 12 illustrate the current-voltage characteristics of the NMOSFET and PMOSFET forming the CMOSFET. In each of FIGS. 11 and 12, the abscissa indicates the gate voltage applied to the gate electrode, and the ordinate indicates the drain current (the driving current flowing through the channel region).

As shown in FIG. 11, when a hafnium silicate nitride (HfSiON) film is used as the gate insulating film, the gate threshold voltage of the PMOSFET changes by about 0.6 V in the negative direction, but that of the NMOSFET changes only by about 0.2 V in the positive direction, compared to the case in which a silicon oxide ($SiO_2$) film is used as the gate insulating film.

As described above, the driving current flowing through the channel region reduces more in the PMOSFET than in the NMOSFET, so the drivability of the PMOSFET decreases. This produces a large difference in drivability between the PMOSFET and NMOSFET.

In this embodiment, therefore, the offset spacers 100A and 100B are formed on the side surfaces of the gate electrode 70 and gate insulating film 50 only in the NMOSFET 220, and no offset spacers are formed in the PMOSFET 230, thereby forming the interface insulating film 170 in the interface between the gate electrode 80 and gate insulating film 60 in the PMOSFET 230.

Negative fixed electric charge is generated in the interface insulating film 170. When the interface insulating film 170 is formed, therefore, the gate threshold voltage of the PMOSFET 230 changes by about 0.16 V in the positive direction (FIG. 12), compared to the case in which no interface insulating film is formed.

As described above, when the interface insulating film 170 is formed, the driving current largely increases, and this improves the drivability of the PMOSFET 230, compared to the case in which no interface insulating film is formed. Consequently, the difference in drivability between the NMOSFET 220 and PMOSFET 230 can be reduced.

Accordingly, the semiconductor device and the method of fabricating the same according to the above embodiment can improve the drivability of a PMOSFET in a CMOSFET using a high-k gate insulating film.

Note that the above embodiment is merely an example and does not limit the present invention. For example, it is also possible to form an N-type semiconductor region in the surface portion of a P-type semiconductor substrate, and a P-type semiconductor region in the surface portion of an N-type semiconductor substrate, instead of forming the P-type semiconductor region 20 and N-type semiconductor region 30 in the surface portion of the semiconductor substrate 10.

What is claimed is:

1. A semiconductor device fabrication method comprising:
   forming a first gate electrode via a first gate insulating film on a P-type semiconductor region formed in a surface portion of a semiconductor substrate, and forming a second gate electrode via a second gate insulating film on an N-type semiconductor region formed in the surface portion of the semiconductor substrate;
   forming a first insulating film on side surfaces of the first gate electrode and the first gate insulating film, and forming a second insulating film on side surfaces of the second gate electrode and the second gate insulating film;
   forming a mask having a pattern corresponding to the P-type semiconductor region;
   etching away the second insulating film by using the mask;
   removing the mask; and
   forming a first gate electrode sidewall insulating film on the side surfaces of the first insulating film, and forming a second gate electrode sidewall insulating film on the side surfaces of the second gate electrode and the second gate insulating film, such that an interface insulating film is formed at an interface between the second gate electrode and the second gate insulating film concurrently with the forming of the second gate electrode sidewall insulating film.

2. A method according to claim 1, further comprising, after the first insulating film and the second insulating film are formed, ion-implanting an N-type impurity into a surface portion of the P-type semiconductor region by using the first gate electrode and the first insulating film as masks, thereby forming a first source region and a first drain region, and ion-implanting a P-type impurity into a surface portion of the N-type semiconductor region by using the second gate electrode and the second insulating film as masks, thereby forming a second source region and a second drain region.

3. A method according to claim 2, further comprising, after the first gate electrode sidewall insulating film and the second gate electrode sidewall insulating film are formed, ion-implanting an N-type impurity into a surface portion of the P-type semiconductor region by using the first gate electrode, the first insulating film, and the first gate electrode sidewall insulating film as masks, thereby forming a third source region and a third drain region, and ion-implanting a P-type impurity into a surface portion of the N-type semiconductor region by using the second gate electrode and the second gate electrode sidewall insulating film as masks, thereby forming a fourth source region and a fourth drain region.

4. A method according to claim 2, wherein each of the first gate insulating film and the second gate insulating film is made of a material selected from the group consisting of a hafnium oxide film, a zirconium oxide film, a silicate film of a hafnium oxide film, an aluminate film of a hafnium oxide film, a silicate film of a zirconium oxide film, an aluminate film of a zirconium oxide film, a silicate nitride film of a hafnium oxide film, an aluminate nitride film of a hafnium oxide film, a silicate nitride film of a zirconium oxide film, and an aluminate nitride film of a zirconium oxide film.

5. A method according to claim 2, wherein the interface insulating film is made of a silicon oxide film, and has a film thickness of 2 to 3 nm.

6. A method according to claim 2, wherein the first insulating film is made of a silicon nitride film, and has a film thickness of about 2 nm.

7. A method according to claim 1, further comprising, after the first gate electrode sidewall insulating film and the second gate electrode sidewall insulating film are formed, ion-implanting an N-type impurity into a surface portion of the P-type semiconductor region by using the first gate electrode, the first insulating film, and the first gate electrode sidewall insulating film as masks, thereby forming a third source region and a third drain region, and ion-implanting a P-type impurity into a surface portion of the N-type semiconductor region by using the second gate electrode and the second gate electrode sidewall insulating film as masks, thereby forming a fourth source region and a fourth drain region.

8. A method according to claim 7, wherein each of the first gate insulating film and the second gate insulating film is made of a material selected from the group consisting of a hafnium oxide film, a zirconium oxide film, a silicate film of a hafnium oxide film, an aluminate film of a hafnium oxide film, a silicate film of a zirconium oxide film, an aluminate film of a zirconium oxide film, a silicate nitride film of a hafnium oxide film, an aluminate nitride film of a hafnium oxide film, a silicate nitride film of a zirconium oxide film, and an aluminate nitride film of a zirconium oxide film.

9. A method according to claim 7, wherein the interface insulating film is made of a silicon oxide film, and has a film thickness of 2 to 3 nm.

10. A method according to claim 7, wherein the first insulating film is made of a silicon nitride film, and has a film thickness of about 2 nm.

11. A method according to claim 1, wherein each of the first gate insulating film and the second gate insulating film is made of a material selected from the group consisting of a hafnium oxide film, a zirconium oxide film, a silicate film of a hafnium oxide film, an aluminate film of a hafnium oxide film, a silicate film of a zirconium oxide film, an aluminate film of a zirconium oxide film, a silicate nitride film of a hafnium oxide film, an aluminate nitride film of a hafnium oxide film, a silicate nitride film of a zirconium oxide film, and an aluminate nitride film of a zirconium oxide film.

12. A method according to claim 1, wherein the interface insulating film is made of a silicon oxide film, and has a film thickness of 2 to 3 nm.

13. A method according to claim 1, wherein the first insulating film is made of a silicon nitride film, and has a film thickness of about 2 nm.

14. A method according to claim 1, wherein a density of nitrogen of the first insulating film is greater than that of the first gate electrode sidewall insulating film.

* * * * *